(12) United States Patent
Tomekawa et al.

(10) Patent No.: US 10,490,591 B2
(45) Date of Patent: Nov. 26, 2019

(54) IMAGING DEVICE COMPRISING MULTILAYER WIRING STRUCTURE AND CAPACITANCE ELEMENT CAPABLE OF HAVING RELATIVELY LARGE CAPACITANCE VALUE

(71) Applicant: PANASONIC INTELLECTUAL PROPERTY MANAGEMENT CO., LTD., Osaka (JP)

(72) Inventors: Yuuko Tomekawa, Osaka (JP); Tokuhiko Tamaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 56 days.

(21) Appl. No.: 15/839,614

(22) Filed: Dec. 12, 2017

(65) Prior Publication Data

US 2018/0114810 A1  Apr. 26, 2018

Related U.S. Application Data

(63) Continuation of application No. 15/073,611, filed on Mar. 17, 2016, now Pat. No. 9,876,046.

(30) Foreign Application Priority Data

Apr. 2, 2015  (JP) .................................. 2015-075729

(51) Int. Cl.
*H01L 27/146* (2006.01)
*H04N 5/363* (2011.01)
(Continued)

(52) U.S. Cl.
CPC .. *H01L 27/14643* (2013.01); *H01L 27/14603* (2013.01); *H01L 27/14609* (2013.01);
(Continued)

(58) Field of Classification Search
CPC ......... H01L 27/14603; H01L 27/14609; H01L 27/14612; H01L 27/14623;
(Continued)

(56) References Cited

U.S. PATENT DOCUMENTS 7,884,401 B2 * 2/2011 Shim ................. H01L 27/14603
257/233
2009/0179293 A1 7/2009 Shim et al.
(Continued)

FOREIGN PATENT DOCUMENTS

JP  2009-164604 A  7/2009
JP  2010-067827 A  3/2010
(Continued)

OTHER PUBLICATIONS

Non-Final Office Action issued in U.S. Appl. No. 15/073,611, dated Jul. 7, 2017.
(Continued)

*Primary Examiner* — Que Tan Le
(74) *Attorney, Agent, or Firm* — McDermott Will & Emery LLP

(57) ABSTRACT

An imaging device includes: a semiconductor substrate; a photoelectric conversion element that, in operation, generates a signal by performing photoelectric conversion on incident light; a multilayer wiring structure including a first wiring layer and a second wiring layer which are provided between the semiconductor substrate and the photoelectric conversion element; and a circuitry that is provided in the semiconductor substrate and the multilayer wiring structure, and, in operation, processes the signal. The circuitry includes a first transistor and a first capacitance element. The first transistor includes a first gate, and a first source region and a first drain region which are provided in the semiconductor substrate. The first capacitance element includes a
(Continued)

first electrode, a second electrode, and a dielectric film disposed between the first electrode and the second electrode. The first electrode is disposed between the photoelectric conversion element and the first gate of the first transistor.

17 Claims, 9 Drawing Sheets

(51) Int. Cl.
  *H04N 5/232* (2006.01)
  *H01L 27/30* (2006.01)
(52) U.S. Cl.
  CPC .. *H01L 27/14612* (2013.01); *H01L 27/14623* (2013.01); *H01L 27/14636* (2013.01); *H01L 27/14665* (2013.01); *H04N 5/363* (2013.01); *H01L 27/307* (2013.01); *H04N 5/23245* (2013.01)
(58) Field of Classification Search
  CPC ......... H01L 27/14636; H01L 27/14665; H01L 27/307; H04N 5/23245; H04N 5/363
  USPC .......................................... 250/208.1, 214 R
  See application file for complete search history.

(56) References Cited

U.S. PATENT DOCUMENTS

| | | |
|---|---|---|
| 2010/0060769 A1 | 3/2010 | Inuiya |
| 2012/0086095 A1 | 4/2012 | Nishiyama et al. |
| 2012/0200752 A1 | 8/2012 | Matsunaga |
| 2013/0099093 A1 | 4/2013 | Kawanabe et al. |
| 2013/0313410 A1 | 11/2013 | Goto |
| 2013/0341491 A1 | 12/2013 | Hirose et al. |
| 2014/0146211 A1 | 5/2014 | Mori et al. |
| 2015/0090998 A1 | 4/2015 | Hirase et al. |

FOREIGN PATENT DOCUMENTS

| | | |
|---|---|---|
| JP | 2012-019169 A | 1/2012 |
| JP | 2012-147169 A | 8/2012 |
| JP | 2012-151771 A | 8/2012 |
| JP | 2013-089869 A | 5/2013 |
| WO | 2010/116974 A1 | 10/2010 |
| WO | 2011/058684 A1 | 5/2011 |
| WO | 2012/117670 A1 | 9/2012 |
| WO | 2013/021577 A1 | 2/2013 |
| WO | 2014/002362 A1 | 1/2014 |

OTHER PUBLICATIONS

Notice of Allwoance issued in U.S. Appl. No. 15/073,611, dated Oct. 12, 2017.

* cited by examiner

IMAGING DEVICE COMPRISING MULTILAYER WIRING STRUCTURE AND CAPACITANCE ELEMENT CAPABLE OF HAVING RELATIVELY LARGE CAPACITANCE VALUE

RELATED APPLICATIONS

This application is a Continuation application Ser. No. 15/073,611, filed on Mar. 17, 2016, which in turn claims the benefit of Japanese Application No. 2015-075729, filed on Apr. 2, 2015, the entire disclosures of which Applications are incorporated by reference herein.

BACKGROUND

Technical Field

The present disclosure relates to imaging devices. More particularly, the present disclosure relates to an imaging device with a photoelectric conversion element including a photoelectric conversion film supported on a semiconductor substrate.

Description of the Related Art

As a metal-oxide-semiconductor (MOS) imaging device, a stacked imaging device is proposed. In the stacked imaging device, a photoelectric conversion film is stacked on the outermost surface of a semiconductor substrate and the charge generated by photoelectric conversion in the photoelectric conversion film is accumulated in a charge accumulation region (which is called "floating diffusion"). The imaging device reads the accumulated charge by using a charge-coupled device (CCD) circuit or a complementary MOS (CMOS) circuit in the semiconductor substrate. For example, Japanese Unexamined Patent Application Publication No. 2009-164604 discloses such an imaging device. Japanese Unexamined Patent Application Publication No. 2012-151771 discloses a solid-state imaging element with a photoelectric conversion layer containing an organic material. Japanese Unexamined Patent Application Publication No. 2010-067827 proposes providing a partition wall between color filters disposed above a photoelectric conversion layer. This partition wall is provided between two filters (two filters selected from among an R color filter, a G color filter, and a B color filter) which are adjacent to each other and have different colors.

SUMMARY

One non-limiting and exemplary embodiment provides the following imaging device.

In one general aspect, the techniques disclosed here feature an imaging device including: a semiconductor substrate; a photoelectric conversion element that, in operation, generates a signal by performing photoelectric conversion on incident light; a multilayer wiring structure including a first wiring layer and a second wiring layer which are provided between the semiconductor substrate and the photoelectric conversion element; and a circuitry that is provided in the semiconductor substrate and the multilayer wiring structure, and, in operation, processes the signal. The circuitry includes a first transistor and a first capacitance element. The first transistor includes a first gate, and a first source region and a first drain region which are provided in the semiconductor substrate. The first capacitance element includes a first electrode, a second electrode, and a dielectric film disposed between the first electrode and the second electrode. The first electrode is disposed between the photoelectric conversion element and the first gate of the first transistor.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
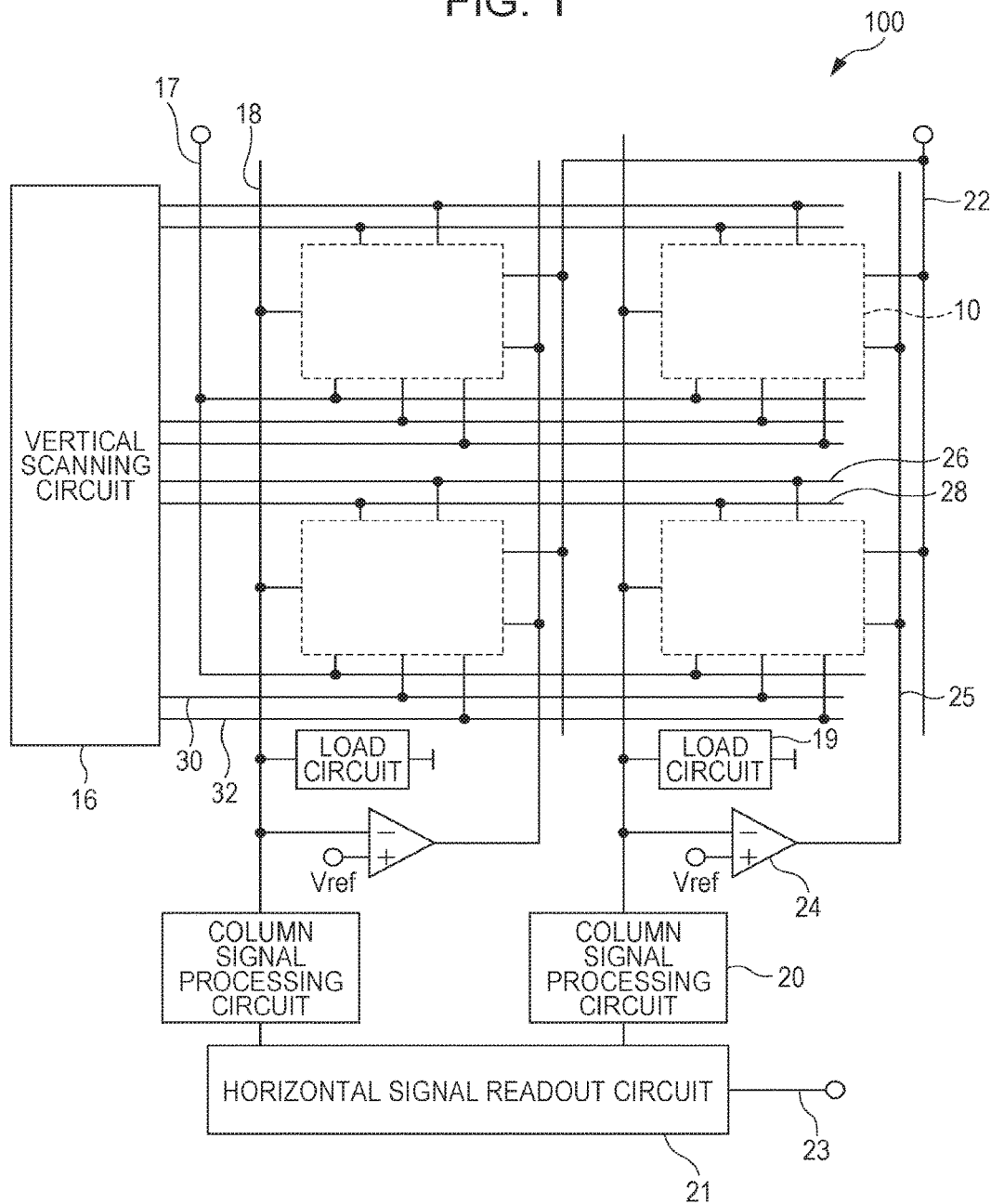
FIG. 1 is a diagram depicting an exemplary circuit configuration of an imaging device according to a first embodiment of the present disclosure.

In the field of imaging devices, noise reduction is required.

Prior to a detailed description of embodiments of the present disclosure, the outline of one aspect of the present disclosure will be described. The outline of one aspect of the present disclosure is as follows.

[Item 1]

An imaging device including: a semiconductor substrate; a photoelectric conversion element that includes a first electrode, a second electrode, and a photoelectric conversion film between the first electrode and the second electrode, is supported on the semiconductor substrate, and, in operation, generates a signal by performing photoelectric conversion on incident light; a multilayer wiring structure including an upper wiring layer and a lower wiring layer which are provided between the semiconductor substrate and the second electrode of the photoelectric conversion element; and a signal detection circuit that is provided in the semiconductor substrate and the multilayer wiring structure, includes a signal detection transistor and a first capacitance element, and, in operation, detects the signal, in which the signal detection transistor includes a gate, and a source region and a drain region which are provided in the semiconductor substrate, the first capacitance element includes a first lower electrode, a first upper electrode, and a dielectric film disposed between the first upper electrode and the first lower electrode, the upper wiring layer is disposed between the second electrode of the photoelectric conversion element and the gate of the signal detection transistor, and the upper wiring layer includes the first upper electrode.

With the configuration of Item 1, since it is possible to form a first capacitance element having a relatively large capacitance value relatively easily in a unit pixel cell, noise such as kTC noise can be further reduced.

[Item 2]

The imaging device described in Item 1, in which the lower wiring layer is disposed between the upper wiring layer and the gate of the signal detection transistor, and the lower wiring layer includes the first lower electrode.

With the configuration of Item 2, it is possible to form the first capacitance element in the multilayer wiring structure.

[Item 3]

The imaging device described in Item 1 or 2, in which the signal detection circuit further includes a second capacitance element including a second lower electrode and a second upper electrode, the capacitance of the second capacitance element is smaller than the capacitance of the first capacitance element, and one of the second lower electrode and the second upper electrode is connected to one of the first lower electrode and the first upper electrode.

With the configuration of Item 3, as is the case with the first capacitance element, it is possible to dispose the second capacitance element relatively easily between the semiconductor substrate and the photoelectric conversion element.

[Item 4]

The imaging device described in Item 3, in which the other of the second lower electrode and the second upper electrode is connected to the second electrode of the photoelectric conversion element.

With the configuration of Item 4, the first capacitance element can be electrically connected to the second electrode of the photoelectric conversion element via the second capacitance element.

[Item 5]

The imaging device described in any one of Items 1 to 4, further including a feedback circuit that, in operation, provides negative feedback on an output of the signal detection circuit, in which the feedback circuit includes an output line, the signal detection circuit further includes a reset transistor including a source and a drain, one of the source and the drain of the reset transistor is connected to the second electrode of the photoelectric conversion element, and the other of the source and the drain of the reset transistor is connected to the output line.

With the configuration of Item 5, it is possible to perform cancellation of kTC noise by using the feedback circuit.

[Item 6]

The imaging device described in any one of Items 1 to 5, in which the multilayer wiring structure further includes a connector which connects the second electrode of the photoelectric conversion element and the gate of the signal detection transistor, and one of the first upper electrode and the first lower electrode surrounds the connector when viewed from the normal direction of the semiconductor substrate.

With the configuration of Item 6, it is possible to suppress the mixing of noise into a charge accumulation node.

[Item 7]

The imaging device described in any one of Items 1 to 6, in which the multilayer wiring structure further includes a signal line which, in operation, applies a reference voltage to the first upper electrode, the first upper electrode has a first surface facing the second electrode of the photoelectric conversion element and a second surface on the side opposite to the first surface, and the first upper electrode is connected to the signal line on the second surface.

With the configuration of Item 7, it is possible to reduce the distance between the second electrode of the photoelectric conversion element and the first upper electrode of the first capacitance element. Moreover, it is possible to establish an electrical connection between a circuit that supplies a fixed voltage and the first upper electrode on a lower surface of the first upper electrode.

[Item 8]

The imaging device described in any one of Items 1 to 7, in which the first upper electrode covers, of the surface of the dielectric film, a portion other than a portion facing the first lower electrode.

With the configuration of Item 8, it is possible to curb the generation of a leakage current in the first capacitance element.

[Item 9]

The imaging device described in any one of Items 1 to 8, in which the second electrode of the photoelectric conversion element and the first upper electrode are formed of the same material.

[Item 10]

The imaging device described in any one of Items 1 to 9, further including a shielding electrode that is disposed with a space left between the shielding electrode and the second electrode of the photoelectric conversion element, in which the shielding electrode surrounds the second electrode of the photoelectric conversion element when viewed from the normal direction of the semiconductor substrate.

[Item 11]

The imaging device described in Item 10, in which, when viewed from the normal direction of the semiconductor substrate, the first upper electrode is disposed between the second electrode of the photoelectric conversion element and the shielding electrode.

Hereinafter, with reference to the drawings, embodiments of the present disclosure will be described in detail. Incidentally, each of the embodiments which will be described below illustrates a comprehensive or specific example. The numerical values, shapes, materials, component elements, arrangement and connection configuration of the component elements, steps, order of steps, and so forth which are described in the following embodiments are mere examples and are not meant to limit the present disclosure. Various aspects which will be described in the present specification can be combined unless a contradiction arises. Moreover, of the component elements in the following embodiments, a component element which is not described in an independent claim describing the broadest concept is described as an arbitrary component element. In the following description, the component elements having virtually the same function will be identified with a common reference character and their explanations are sometimes omitted.

First Embodiment

FIG. 1 depicts the outline of an exemplary circuit configuration of an imaging device according to a first embodiment of the present disclosure. An imaging device 100 depicted in FIG. 1 includes a plurality of unit pixel cells 10 and peripheral circuits. The plurality of unit pixel cells 10 form a photosensitive region (a pixel region) by being two-dimensionally arranged on a semiconductor substrate.

In the example depicted in FIG. 1, the plurality of unit pixel cells 10 are arranged in a row direction and in a column direction. In the present specification, the row direction and the column direction are a direction in which rows extend and a direction in which columns extend, respectively. Here, a vertical direction on the plane of paper is the column direction and a horizontal direction on the plane of paper is the row direction. The plurality of unit pixel cells 10 may be one-dimensionally arranged. In other words, the imaging device 100 may be a line sensor.

Each of the unit pixel cells 10 is connected to power-supply wiring 22. To each of the unit pixel cells 10, a predetermined power supply voltage is supplied via the power-supply wiring 22. As will be described in detail later, each of the unit pixel cells 10 includes a photoelectric converting portion that performs photoelectric conversion on incident light and a signal detection circuit that detects a signal generated by the photoelectric converting portion. As depicted in FIG. 1, the imaging device 100 has an accumulation control line 17 for applying the same fixed voltage to all the photoelectric converting portions.

The peripheral circuits of the imaging device 100 include a vertical scanning circuit (which is also called a "row scanning circuit") 16, a plurality of load circuits 19, a plurality of column signal processing circuits (which are also called "row signal accumulation circuits") 20, a plurality of inverting amplifiers 24, and a horizontal signal readout circuit (which is also called a "column scanning circuit") 21. One load circuit 19, one column signal processing circuit 20, and one inverting amplifier 24 are arranged for each of the columns of the two-dimensionally arranged unit pixel cells 10.

The vertical scanning circuit 16 is connected to address signal lines 30 and reset signal lines 26. By applying a predetermined voltage to the address signal lines 30, the vertical scanning circuit 16 selects, on a row-by-row basis, the plurality of unit pixel cells 10 arranged in each row. By selecting the plurality of unit pixel cells 10 on a row-by-row basis, the reading of a signal voltage of the selected unit pixel cells 10 and the resetting of pixel electrodes which will be described later are performed.

In the example depicted in FIG. 1, the vertical scanning circuit 16 is also connected to feedback control lines 28 and sensitivity adjustment lines 32. As will be described later, as a result of the vertical scanning circuit 16 applying a predetermined voltage to the feedback control lines 28, it is possible to form a feedback circuit that provides negative feedback on the outputs of the unit pixel cells 10. Moreover, the vertical scanning circuit 16 can supply a predetermined voltage to the plurality of unit pixel cells 10 via the sensitivity adjustment lines 32.

The unit pixel cells 10 arranged in each column are electrically connected to the corresponding column signal processing circuit 20 via a vertical signal line 18 corresponding to each column. To each vertical signal line 18, one load circuit 19 is electrically connected. Each column signal processing circuit 20 performs noise suppression signal processing typified by correlated double sampling, analog-digital conversion (AD conversion), and so forth. To each column signal processing circuit 20 provided for each of the columns of the unit pixel cells 10, the horizontal signal readout circuit 21 is electrically connected. The horizontal signal readout circuit 21 sequentially reads signals from the plurality of column signal processing circuits 20 into a horizontal common signal line 23.

In the configuration illustrated in FIG. 1, the inverting amplifiers 24 are provided, one for each of the columns. A negative-side input terminal of each inverting amplifier 24 is connected to the corresponding vertical signal line 18. To a positive-side input terminal of the inverting amplifier 24, a predetermined voltage (1 V or a positive voltage close to 1 V, for example) Vref is supplied. Moreover, an output terminal of each inverting amplifier 24 is connected, via a feedback line 25 provided for each column, to the plurality of unit pixel cells 10 having connection with the negative-side input terminal of the inverting amplifier 24. The inverting amplifier 24 forms part of the feedback circuit that provides negative feedback on the outputs of the unit pixel cells 10. The inverting amplifier 24 may be called a feedback amplifier. The operation of the inverting amplifier 24 will be described later.

Figure 2:
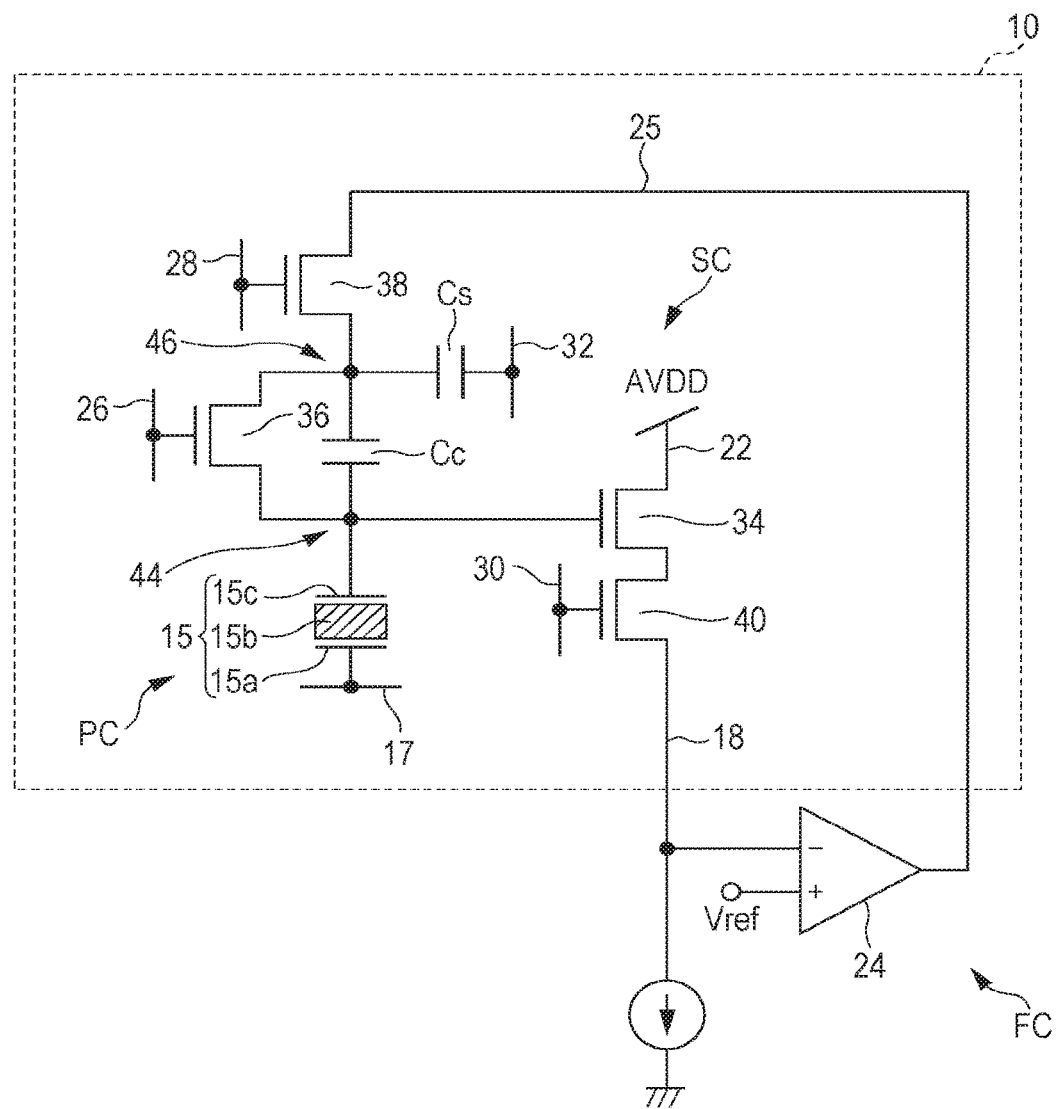
FIG. 2 is a diagram depicting an exemplary circuit configuration of a unit pixel cell depicted in FIG. 1.

FIG. 2 depicts an exemplary circuit configuration of each unit pixel cell 10 depicted in FIG. 1. The unit pixel cell 10 includes a photoelectric converting portion PC and a signal detection circuit SC.

The photoelectric converting portion PC includes a photoelectric conversion element 15 having a first electrode 15a, a photoelectric conversion film 15b, and a second electrode (a pixel electrode) 15c. The first electrode 15a of the photoelectric conversion element 15 is connected to the accumulation control line 17, and the second electrode 15c of the photoelectric conversion element 15 is connected to a charge accumulation node (which is also called a "floating diffusion node") 44. By controlling the potential of the first electrode 15a via the accumulation control line 17, it is possible to collect, with the second electrode 15c, either a positive hole or an electron of an electron-hole pair generated by photoelectric conversion. When the positive hole is used as signal charge, it is necessary simply to make the potential of the first electrode 15a higher than the potential of the second electrode 15c. The following description deals with a case in which the positive hole is used as signal charge. A voltage of about 10 V, for example, is applied to the first electrode 15a via the accumulation control line 17. As a result, the signal charge is accumulated in the charge accumulation node 44. It goes without saying that the electron may be used as signal charge.

The signal detection circuit SC includes a signal detection transistor 34 that amplifies a signal generated by the photoelectric conversion element 15 and a first capacitance element Cs. In the example depicted in FIG. 2, the signal detection circuit SC further includes a reset transistor (a first reset transistor) 36, a second capacitance element Cc having a capacitance value smaller than the capacitance value of the first capacitance element Cs, and an address transistor 40. As described above, in the present disclosure, each of the unit pixel cells 10 has one or more capacitance elements in a pixel. As will be described in detail later, providing the first capacitance element Cs with a relatively large capacitance value is beneficial because doing so can effectively reduce kTC noise.

The gate of the signal detection transistor 34 is connected to the charge accumulation node 44. In other words, the gate of the signal detection transistor 34 has an electrical connection with the second electrode 15c. One of the source and the drain of the signal detection transistor 34 (the drain if the signal detection transistor 34 is an N-channel MOS) is connected to the power-supply wiring (a source follower power supply) 22, and the other is connected to the vertical signal line 18. The signal detection transistor 34 and the load circuit 19 (which is not depicted in FIG. 2; see FIG. 1) form a source follower circuit.

The unit pixel cell 10 includes the address transistor (a row selection transistor) 40. The drain or the source of the address transistor 40 is connected to one of the source and the drain of the signal detection transistor 34, the one which is not connected to the power-supply wiring 22. The gate of the address transistor 40 is connected to the address signal line 30.

A voltage commensurate with the amount of signal charge accumulated in the charge accumulation node 44 is applied to the gate of the signal detection transistor 34. The signal detection transistor 34 amplifies this voltage. The voltage amplified by the signal detection transistor 34 is selectively read by the address transistor 40 as a signal voltage.

In the configuration illustrated in FIG. 2, one of the electrodes of the first capacitance element Cs is connected to the sensitivity adjustment line 32. The potential of the sensitivity adjustment line 32 is set at 0 V, for example. Typically, the potential of the sensitivity adjustment line 32 is fixed when the imaging device 100 is operating. The sensitivity adjustment line 32 can be used to control the potential of the charge accumulation node 44. The other of the electrodes of the first capacitance element Cs is connected to one of the electrodes of the second capacitance element Cc. Hereinafter, a node including a point of connection between the first capacitance element Cs and the second capacitance element Cc is sometimes called a reset drain node 46.

The other of the electrodes of the second capacitance element Cc is connected to the charge accumulation node 44. That is, of the electrodes of the second capacitance element Cc, the electrode which is not connected to the reset drain node 46 has an electrical connection with the second electrode 15c of the photoelectric conversion element 15. Incidentally, in this example, the reset transistor 36 is connected in parallel to the second capacitance element Cc. That is, one of the source and the drain of the reset transistor 36 is connected to the charge accumulation node 44 and has an electrical connection with the second electrode 15c of the photoelectric conversion element 15. The other of the source and the drain of the reset transistor 36 is connected to the reset drain node 46.

In the configuration illustrated in FIG. 2, the unit pixel cell 10 further includes a second reset transistor 38 having a source and a drain, one of which is connected to the reset drain node 46 and the other to the feedback line 25. The gate of the second reset transistor 38 is connected to the feedback control line 28. As will be described in detail later, by controlling the voltage of the feedback control line 28, it is possible to form a feedback circuit FC that provides negative feedback on the output of the signal detection circuit SC. In the configuration depicted in FIG. 2, one of the source and the drain of the reset transistor 36, the one which is connected to the reset drain node 46, and the feedback line 25 which is an output line of the feedback circuit FC are connected via the second reset transistor 38.

The above-described signal detection transistor 34, first reset transistor 36, address transistor 40, and second reset transistor 38 may be N-channel MOSs or P-channel MOSs. All of the signal detection transistor 34, the first reset transistor 36, the address transistor 40, and the second reset transistor 38 do not have to be either N-channel MOSs or P-channel MOSs. Hereinafter, an example in which the signal detection transistor 34, the first reset transistor 36, the address transistor 40, and the second reset transistor 38 are N-channel MOSs will be described.

(Device Structure of the Unit Pixel Cell 10)

Next, with reference to FIGS. 3 to 5, an example of the device structure of the unit pixel cell 10 will be described.

Figure 3:
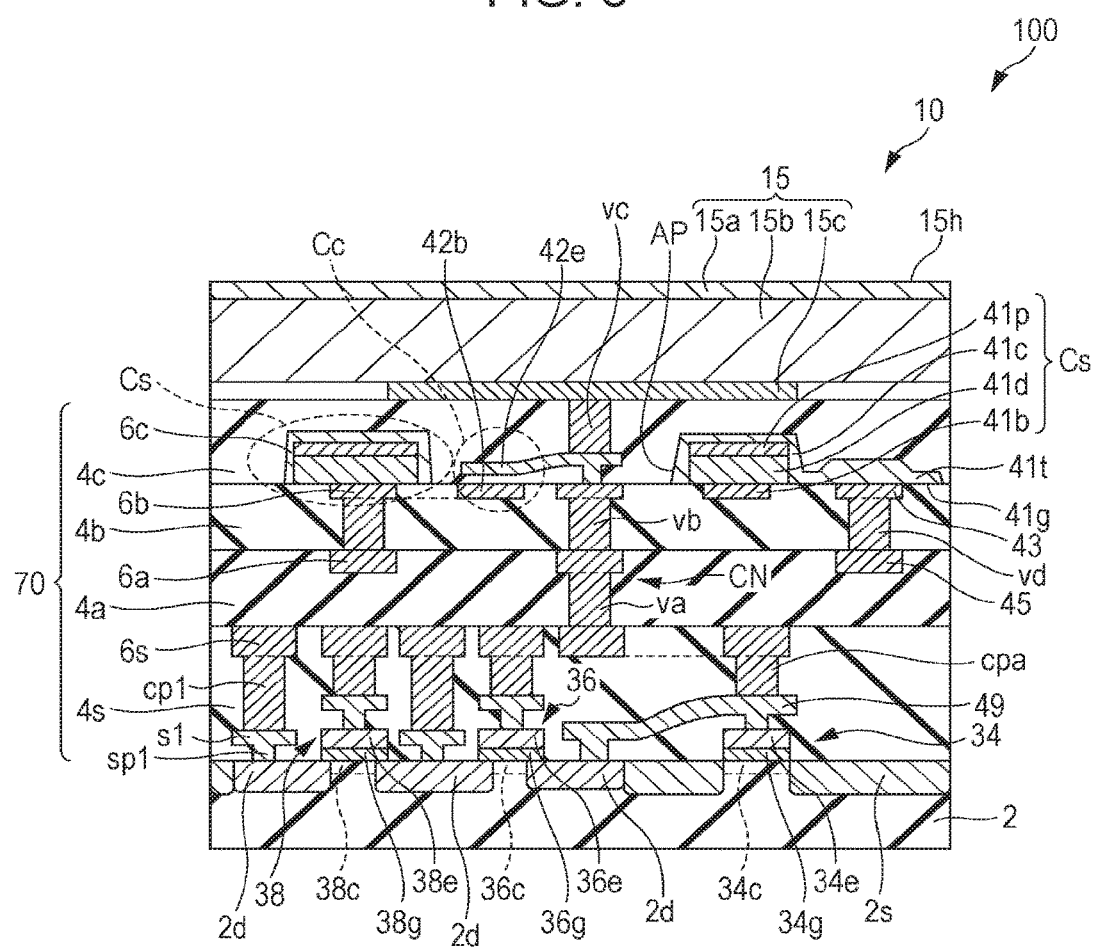
FIG. 3 is a schematic sectional view of the unit pixel cell of the imaging device.
Figure 4:
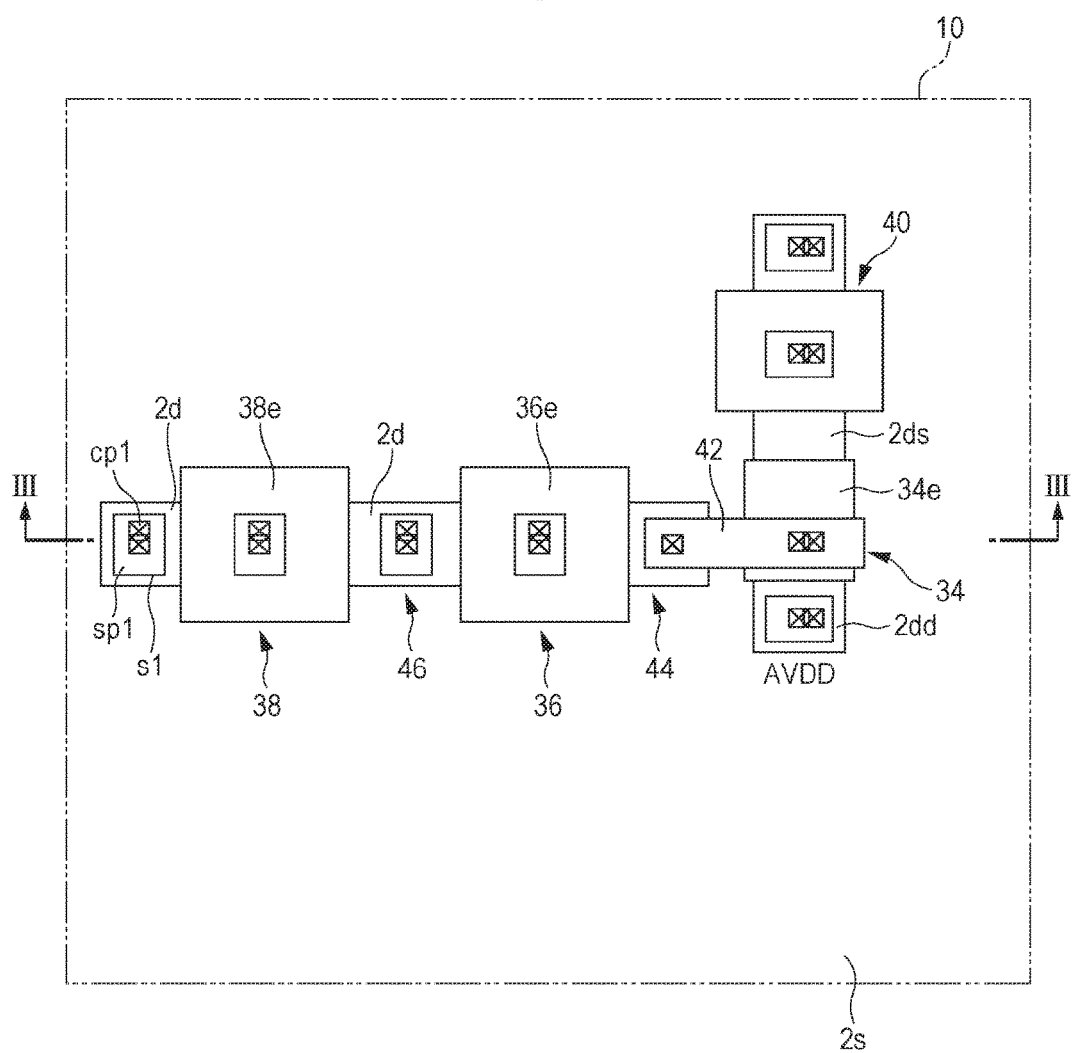
FIG. 4 is a schematic plan view depicting an example of the layout of the elements in the unit pixel cell.

FIG. 3 schematically depicts the cross-section of one of the unit pixel cells 10 of the imaging device 100. FIG. 4 schematically depicts an example of the layout of the elements in the unit pixel cell 10. FIG. 3 corresponds to the sectional view taken on the line III-III depicted in FIG. 4.

As depicted in FIG. 3, the imaging device 100 includes a semiconductor substrate 2, the photoelectric conversion element 15, and a multilayer wiring structure 70 disposed between the semiconductor substrate 2 and the photoelectric conversion element 15. FIG. 3 depicts an example of the cross-section of the unit pixel cell 10, the cross-section observed when the unit pixel cell 10 is cut in a plane perpendicular to the principal surface of the semiconductor substrate 2.

As the semiconductor substrate 2, for example, a silicon substrate can be used. The semiconductor substrate 2 is not limited to a substrate whose whole portion is a semiconductor. The semiconductor substrate 2 may be, for example, an insulating substrate with a surface on which a semiconductor layer is provided, the surface on the side where a photosensitive region is formed. Hereinafter, an example in which a p-type silicon (Si) substrate is used as the semiconductor substrate 2 will be described.

The semiconductor substrate 2 (here, the p-type silicon substrate) has an impurity region $2d$ (here, an N-type region). In the configuration illustrated in FIGS. 3 and 4, the second reset transistor 38 includes two impurity regions $2d$, a gate insulating film $38g$ formed on the semiconductor substrate 2, and a gate electrode $38e$ formed on the gate insulating film $38g$. Between the two impurity regions $2d$ as the source or the drain, a channel region $38c$ is formed. One of the two impurity regions $2d$ in the second reset transistor 38 is connected to the feedback line 25 (see FIG. 2), which is not depicted in the drawing, via a polysilicon plug sp1, a wiring layer s1, and a contact plug cp1.

As is the case with the second reset transistor 38, the first reset transistor 36 includes two impurity regions $2d$, a gate insulating film $36g$ formed on the semiconductor substrate 2, and a gate electrode $36e$ formed on the gate insulating film $36g$. Between the two impurity regions $2d$ as the source or the drain, a channel region $36c$ is formed. In the example depicted in the drawings, the first reset transistor 36 and the second reset transistor 38 share one of the impurity regions $2d$.

Likewise, the signal detection transistor 34 includes two impurity regions $2d$, a gate insulating film $34g$ formed on the semiconductor substrate 2, and a gate electrode $34e$ formed on the gate insulating film $34g$. Incidentally, the two impurity regions $2d$ in the signal detection transistor 34 are located in the front and back sides of the plane of paper in FIG. 3, and the two impurity regions $2d$ in the signal detection transistor 34 are not depicted in FIG. 3. In FIG. 3, the gate insulating film $34g$, the gate electrode $34e$, and a channel region $34c$ formed between the two impurity regions $2d$, the gate insulating film $34g$, the gate electrode $34e$, and the channel region $34c$ of the signal detection transistor 34, are depicted. These two impurity regions $2d$ formed in the semiconductor substrate 2, the impurity regions $2d$ which are not depicted in FIG. 3, function as a source region and a drain region of the signal detection transistor 34 (a source region $2ds$ and a drain region $2dd$ which are depicted in FIG. 4).

The address transistor 40 can also have almost the same configuration as the signal detection transistor 34. In the example which is described here, the address transistor 40 and the signal detection transistor 34 share one of the impurity regions $2d$ (see FIG. 4).

The semiconductor substrate 2 has an element separation region 2s for electrical separation between the elements. In the example depicted in FIG. 4, a group of the first reset transistor 36 and the second reset transistor 38 and a group of the signal detection transistor 34 and the address transistor 40 are separated from each other by the element separation region 2s. The unit pixel cells 10 are separated from each other by the element separation regions 2s. The element separation region 2s can be formed by performing acceptor ion implantation under a predetermined implantation condition, for example.

Description will be given with reference to FIG. 3. The unit pixel cell 10 has the photoelectric conversion element 15 supported on the semiconductor substrate 2. As already described earlier, the photoelectric conversion element 15 has the first electrode 15a, the photoelectric conversion film 15b, and the second electrode 15c. The photoelectric conversion element 15 typically has a structure in which the photoelectric conversion film 15b is sandwiched between the first electrode 15a and the second electrode 15c. In the example depicted in FIG. 3, the second electrode 15c of the photoelectric conversion element 15 is stacked on the multilayer wiring structure 70. That is, in the embodiment of the present disclosure, the photoelectric converting portion PC is not formed in the semiconductor substrate 2 and is provided above the semiconductor substrate 2. Incidentally, the term "above" in the present specification is used to indicate the relative arrangement of the members and is not meant to limit the position of the imaging device of the present disclosure. The same goes for the terms "upper" and "lower" in the present specification.

The second electrodes 15c are electrically separated from each other between the plurality of unit pixel cells 10. Typically, the second electrodes 15c adjacent to each other are electrically separated from each other by an insulating layer formed of silicon dioxide, for example. Each second electrode 15c collects the charge generated by photoelectric conversion in the photoelectric conversion film 15b. The second electrode 15c can be formed of, for example, a metal such as aluminum or copper, a metal nitride, or polysilicon provided with conductivity by being doped with impurities.

The photoelectric conversion film 15b is formed of an organic material or an inorganic material such as amorphous silicon. The photoelectric conversion film 15b may include a layer formed of an organic material and a layer formed of an inorganic material.

The first electrode 15a faces the second electrode 15c with the photoelectric conversion film 15b sandwiched therebetween. In this example, the first electrode 15a is provided on the side of the photoelectric conversion element 15 where a light-receiving surface 15h is located, the light-receiving surface 15h on which light from a subject is incident. The first electrode 15a may be formed directly on the photoelectric conversion film 15b, or another layer may be disposed between the first electrode 15a and the photoelectric conversion film 15b. The first electrode 15a is formed of a transparent conductive material such as ITO.

The photoelectric conversion film 15b and the first electrode 15a are typically formed over a plurality of pixels. However, as is the case with the second electrode 15c, at least one of the photoelectric conversion film 15b and the first electrode 15a may be electrically separated between the plurality of unit pixel cells 10.

As depicted in FIG. 3, between the photoelectric conversion element 15 and the semiconductor substrate 2, the multilayer wiring structure 70 is provided. The multilayer wiring structure 70 includes a connecting portion CN for electrically connecting the second electrode 15c of the photoelectric conversion element 15 and the gate electrode 34e of the signal detection transistor 34 formed on the semiconductor substrate 2. The connecting portion CN may be part of the charge accumulation node 44. Hereinafter, with reference to FIG. 3, the configuration of the multilayer wiring structure 70 will be described in more detail.

The multilayer wiring structure 70 typically includes one or more insulating layers and one or more wiring layers. In the configuration illustrated in FIG. 3, the multilayer wiring structure 70 includes an insulating layer 4s formed in such a way as to cover the signal detection transistor 34 and the reset transistors 36 and 38, an insulating layer 4a formed on the insulating layer 4s, an insulating layer 4b formed on the insulating layer 4a, and an insulating layer 4c formed on the insulating layer 4b. The insulating layer 4s, the insulating layer 4a, the insulating layer 4b, and the insulating layer 4c are formed of silicon dioxide, for example.

In the configuration illustrated in FIG. 3, the multilayer wiring structure 70 includes a wiring layer s1, a wiring layer 6s, a wiring layer 6a, a wiring layer 6b, and a wiring layer 6c. The number of insulating layers and wiring layers included in the multilayer wiring structure 70 is not limited to the number of layers illustrated in FIG. 3 and can be set arbitrarily.

The wiring layer s1 is formed in the insulating layer 4s. In this example, the wiring layer s1 is formed of polysilicon. The wiring layer s1 includes, as part thereof, polysilicon wiring 49 electrically connecting the gate electrode 34e of the signal detection transistor 34 and the drain (one of the impurity regions 2d) of the reset transistor 36.

The wiring layer 6s is buried in the upper surface of the insulating layer 4s. The wiring layer 6a and the wiring layer 6b are buried in the upper surface of the insulating layer 4a and the upper surface of the insulating layer 4b, respectively. The wiring layer 6c is disposed in the insulating layer 4c. Incidentally, the "upper surface" in the present specification means, of two principal surfaces of a layer to which attention is being paid, a principal surface closer to the photoelectric conversion element 15 than the semiconductor substrate 2. Moreover, the "lower surface" means, of the two principal surfaces of the layer to which attention is being paid, a principal surface (a principal surface opposite to the "upper surface") closer to the semiconductor substrate 2 than the photoelectric conversion element 15. The terms "upper surface" and "lower surface" in the present specification are used to differentiate between the principal surfaces of the layers included in the multilayer wiring structure 70 and are not meant to limit the position of the imaging device of the present disclosure.

In the example depicted in FIG. 3, the multilayer wiring structure 70 further includes a contact plug cpa, a via va, and a via vb. The contact plug cpa is formed in the insulating layer 4s. The contact plug cpa electrically connects the wiring layer s1 (here, the polysilicon layer) and the wiring layer 6s. The via va and the via vb are formed in the insulating layer 4a and the insulating layer 4b, respectively. The via va electrically connects the wiring layer 6s and the wiring layer 6a, and the via vb electrically connects the wiring layer 6a and the wiring layer 6b. The contact plug cpa, the wiring layers 6s, 6a, and 6b, and the vias va and vb are each formed of a metal, for example. In the configuration illustrated in FIG. 3, the contact plug cpa, at least part of the wiring layer 6s, the via va, at least part of the wiring layer 6a, the via vb, at least part of the wiring layer 6b, and a via vc and an upper electrode 42e of the second capacitance element Cc, which will be described later, are part of the above-described connecting portion CN.

As depicted in FIG. 3, in the embodiment of the present disclosure, the first capacitance element Cs is formed in the multilayer wiring structure 70. That is, the signal detection circuit SC of the embodiment of the present disclosure, the signal detection circuit SC having the signal detection transistor 34 and the first capacitance element Cs, is formed on the semiconductor substrate 2 and in the multilayer wiring structure 70. Hereinafter, with reference to the drawing, a typical example of the configuration of the first capacitance element Cs will be described in more detail.

The first capacitance element Cs has a lower electrode 41b, an upper electrode 41c, and a dielectric film 41d disposed between the lower electrode 41b and the upper electrode 41c. In the configuration illustrated in FIG. 3, the upper electrode 41c of the first capacitance element Cs is at least part of the wiring layer 6c located between the second electrode 15c of the photoelectric conversion element 15 and the gate electrode 34e of the signal detection transistor 34. Moreover, the lower electrode 41b of the first capacitance element Cs is at least part of the wiring layer 6b located between the wiring layer 6c and the gate electrode 34e of the signal detection transistor 34.

By disposing the first capacitance element Cs in the multilayer wiring structure 70 provided between the semiconductor substrate 2 and the photoelectric conversion element 15, it is possible to form the first capacitance element Cs having a larger capacitance value. In particular, by disposing the first capacitance element Cs between the photoelectric conversion element 15 and the gate electrode 34e of the signal detection transistor 34, it is possible to suppress interference between the wiring layer including the gate electrode 34e of the signal detection transistor 34 and the upper electrode 41c and the lower electrode 41b of the first capacitance element Cs and secure a larger electrode area. As described above, by disposing the first capacitance element Cs in the multilayer wiring structure 70, flexibility in designing the shape of the electrode in the first capacitance element Cs is increased. Incidentally, the shape of the upper electrode 41c observed when the upper electrode 41c is viewed from the normal direction of the semiconductor substrate 2 does not have to be identical with the shape of the lower electrode 41b. The upper electrode 41c simply has to include a portion facing at least part of the lower electrode 41b when viewed from the normal direction of the semiconductor substrate 2.

In this example, the upper electrode 41c has an opening AP in the center thereof. As depicted in FIG. 3, the connecting portion CN connecting the second electrode 15c of the photoelectric conversion element 15 and the gate electrode 34e of the signal detection transistor 34 passes through the opening AP provided in the upper electrode 41c.

In the configuration illustrated in FIG. 3, in the opening AP, the second capacitance element Cc in the signal detection circuit SC is disposed. The second capacitance element Cc has a lower electrode 42b and an upper electrode 42e facing the lower electrode 42b with part of the insulating layer 4c sandwiched therebetween. The part of the insulating layer 4c, the part sandwiched between the lower electrode 42b and the upper electrode 42e, functions as a dielectric film in the second capacitance element Cc. The upper electrode 42e (typically, the metal electrode) is connected to the second electrode 15c of the photoelectric conversion element 15 via the via vc. This via vc is part of the above-described connecting portion CN. That is, the second capacitance element Cc has an electrical connection with the charge accumulation node 44. Forming the dielectric film in the second capacitance element Cc by using a material with good insulation properties is beneficial because, if a leakage current is generated between the upper electrode 42e and the lower electrode 42b of the second capacitance element Cc, noise caused by the leakage current is mixed into an output signal.

Incidentally, in this example, the lower electrode 42b of the second capacitance element Cc is at least part of the wiring layer 6b and is electrically connected to the lower electrode 41b of the first capacitance element Cs. Here, the lower electrode 42b of the second capacitance element Cc is located in the layer in which the lower electrode 41b of the first capacitance element Cs is located. However, the arrangement of the second capacitance element Cc in the unit pixel cell 10 is not limited to the example depicted in FIG. 3. That is, the lower electrode 42b of the second capacitance element Cc may be formed in a layer which is different from the insulating layer 4b, and the upper electrode 42e may be formed in a layer which is different from the insulating layer 4c.

In the configuration illustrated in FIG. 3, the lower electrode 41b of the first capacitance element Cs is electrically connected to the second electrode 15c of the photoelectric conversion element 15 via the second capacitance element Cc. As described above, since the first capacitance element Cs has an electrical connection with the charge accumulation node 44, if a leakage current is generated between the upper electrode 41c and the lower electrode 41b of the first capacitance element Cs, noise caused by the leakage current is mixed into an output signal. Thus, from the viewpoint of suppressing the leakage current, forming the dielectric film 41d of the first capacitance element Cs by using a material with good insulation properties is beneficial.

Disposing the first capacitance element Cs in the multilayer wiring structure 70 makes it relatively easy to adopt a material having a relatively high permittivity as the material for forming the dielectric film 41d. For example, as the material for forming the dielectric film 41d, a material which is different from a material (for example, silicon dioxide) forming the insulating layer 4c covering the dielectric film 41d can be used.

The dielectric film 41d of the first capacitance element Cs is formed of, for example, a metal oxide or a metal nitride. An example of the material for forming the dielectric film 41d is an oxide or a nitride containing one or more elements selected from a group composed of Zr, Al, La, Ba, Ta, Ti, Bi, Sr, Si, Y, and Hf. The material for forming the dielectric film 41d may be a binary compound, a ternary compound, or a quaternary compound.

To the formation of the dielectric film 41d, atomic layer deposition (ALD), for example, can be applied. With ALD, it is possible to stack different atoms in layers in such a way that a few atoms of one type are in one layer. Specifically, material compound molecules (precursors) are introduced into a vacuum chamber inside which a substrate is placed. The introduced precursors are made to adsorb onto the surface of the substrate in the vacuum chamber. Then, desired atoms in the precursors are left by a chemical reaction, whereby one layer of the atoms is formed.

Here, as the dielectric film 41d of the first capacitance element Cs, a film of Hf oxide is used. In the formation of the film of Hf oxide, tetrakis (ethylmethylamido) hafnium is used as a precursor and plasma discharge is performed after the introduction of the precursor. By performing plasma discharge in an atmosphere of oxygen, oxidation of Hf is promoted. By repeating the above process, layers of $HfO_2$ are stacked, one layer at a time. In the embodiment of the present disclosure, by repeating the introduction of gaseous precursors and plasma discharge 250 times, a film having a thickness of 22 nm is formed as the dielectric film 41d.

According to the embodiment of the present disclosure, the dielectric film 41d is formed relatively easily by using a material which is different from the material forming the insulating layer in the multilayer wiring structure 70. Therefore, it is possible to form the dielectric film 41d relatively easily by using a material having a relatively high permittivity. That is, it is easy to form a capacitance element having a relatively large capacitance value in the unit pixel cell. As will be clear from an exemplary operation, which will be described later, of the imaging device 100 of the present disclosure, the larger the capacitance value of the first capacitance element Cs is, the higher noise reduction effect can be obtained. Moreover, the larger capacitance value of the first capacitance element Cs is advantageous to shooting in high illumination because the larger capacitance value of the first capacitance element Cs makes it possible to increase the capacity of the whole signal charge accumulation region. Incidentally, the dielectric film 41d may include two or more films formed of different materials. By forming the dielectric film 41d as a laminated film of two or more layers, it is possible to obtain a dielectric film which makes use of the advantages of the materials forming the layers. If a sufficient electrode area is secured, the dielectric film 41d may be formed by using the material forming the insulating layer (for example, the insulating layer 4c) in the multilayer wiring structure 70.

The shape of the dielectric film 41d observed when the dielectric film 41d is viewed from the normal direction of the semiconductor substrate 2 can be set arbitrarily. In the configuration illustrated in FIG. 3, the dielectric film 41d is disposed around the connecting portion CN connecting the second electrode 15c of the photoelectric conversion element 15 and the gate electrode 34e of the signal detection transistor 34. The dielectric film 41d may be a continuous single film or may include a plurality of portions disposed in different locations in one layer.

To patterning of the dielectric film 41d, photolithography which is introduced in a common semiconductor process can be applied. By performing processes such as application of a resist, exposure of the resist to light, development of the resist, and etching, it is possible to leave a dielectric film (here, a film of Hf oxide) in a desired region. Incidentally, in the process of removing the resist, as a result of the dielectric film 41d being exposed to plasma or radicals which are used in ashing, the dielectric film 41d is sometimes damaged. Moreover, the dielectric film 41d may be exposed to a resist stripping liquid which is used to remove the residual resist. If the dielectric film 41d is damaged, a leakage current between the upper electrode 41c and the lower electrode 41b may be increased.

In the configuration illustrated in FIG. 3, a protective film 41p is provided between the dielectric film 41d and the upper electrode 41c. By providing the protective film 41p on the upper surface of the dielectric film 41d, it is possible to suppress damage to the dielectric film 41d which is caused by the removal of the resist.

An example of a material for forming the protective film 41p is a metal such as Cu or Al or polysilicon. Using a material having a relatively high electric conductivity as the material for forming the protective film 41p is beneficial because the use of such a material makes it possible to make the potential of the protective film 41p almost equal to the potential of the upper electrode 41c. Assume that the protective film 41p is formed of an insulating material which is different from the material forming the dielectric film 41d. In this case, the first capacitance element Cs can be regarded as two capacitance elements connected in series. As described earlier, the dielectric film 41d can be formed of a material having a relatively high permittivity. At this time, if the permittivity of the material forming the protective film 41p is lower than the permittivity of the material forming the dielectric film 41d, the combined capacitance in series junction of the two capacitance elements becomes lower than the combined capacitance which is observed when the protective film 41p is not provided. By using a material having a relatively high electric conductivity as the material for forming the protective film 41p, it is possible to suppress such a reduction in the capacitance value in the first capacitance element Cs which is caused by the protective film 41p interposed between the upper electrode 41c and the lower electrode 41b.

As depicted in FIG. 3, the upper electrode 41c of the first capacitance element Cs may cover the surfaces of the dielectric film 41d other than the surface thereof facing the lower electrode 41b. In the configuration illustrated in FIG. 3, the upper electrode 41c of the first capacitance element Cs is formed in such a way as to cover the upper surface and the side surfaces (the surfaces connecting the upper surface and the lower surface) of the dielectric film 41d.

In the configuration illustrated in FIG. 3, the upper electrode 41c includes a connecting portion 41t extending along the upper surface of the insulating layer 4b. The connecting portion 41t is connected to a terminal 43 at a lower surface 41g thereof. The terminal 43 is part of the wiring layer 6b and is connected, via a via vd, to wiring 45 which is part of the wiring layer 6a. This wiring 45 has an electrical connection with the sensitivity adjustment line 32 (see FIG. 2) which is not depicted in the drawing. That is, in this example, the upper electrode 41c is electrically connected to the sensitivity adjustment line 32 via the terminal 43 which is part of the wiring layer 6b, the via vd, and the wiring 45 which is part of the wiring layer 6a. When the imaging device 100 is operating, a predetermined voltage is supplied to the upper electrode 41c via the sensitivity adjustment line 32. Typically, as a result of the predetermined voltage being supplied to the upper electrode 41c via the sensitivity adjustment line 32 when the imaging device 100 is operating, the potential of the upper electrode 41c is fixed at a fixed potential. Incidentally, by controlling the potential of the upper electrode 41c via the sensitivity adjustment line 32, it is possible to control the potential of the charge accumulation node 44. In other words, by adjusting the voltage which is supplied to the upper electrode 41c via the sensitivity adjustment line 32, it is also possible to adjust the sensitivity of the imaging device 100.

As described above, the upper electrode 41c can be electrically connected to the sensitivity adjustment line 32 at the lower surface 41g on the side opposite to the upper surface facing the second electrode 15c of the photoelectric conversion element 15. By providing a contact for electrical connection with the sensitivity adjustment line 32 on the lower surface 41g of the upper electrode 41c, it is possible to prevent the wiring from becoming complicated. Moreover, it is possible to reduce the distance between the upper electrode 41c of the first capacitance element Cs and the second electrode 15c of the photoelectric conversion element 15. The result of the simulation performed by the inventors is as follows. When the distance between the upper electrode 41c of the first capacitance element Cs and the second electrode 15c of the photoelectric conversion element 15 is minimized, the parasitic capacitance between the charge accumulation regions between the pixels adjacent to each other is reduced. This phenomenon is considered to be caused by a reduction in the space through which an electric line of force passes, the electric line of force connecting the second electrode 15c of a certain pixel and the charge accumulation region of another pixel adjacent to the certain pixel, with a reduction in the distance between the upper electrode 41c and the second electrode 15c.

As depicted in FIG. 3, the upper electrode 41c can be disposed in a position in which the upper electrode 41c overlaps with at least one of the channel regions of the transistors formed in the semiconductor substrate 2 when viewed from the normal direction of the semiconductor substrate 2. In this example, the upper electrode 41c covers the channel region 38c of the second reset transistor 38 and the channel region 34c of the signal detection transistor 34. The upper electrode 41c may be a light-blocking electrode. By disposing the light-blocking electrode in a position in which the light-blocking electrode overlaps with the channel region of the transistor, it is possible to suppress entrance of light to the channel region of the transistor on the semiconductor substrate 2.

As already described earlier, in the stacked imaging device, the charge generated as a result of the light entering the photoelectric converting portion is collected by the pixel electrode provided in each pixel and is accumulated in the charge accumulation region. By reading the charge accumulated in the charge accumulation region by using the signal detection circuit, an electrical signal commensurate with the amount of light in each pixel can be obtained. That is, in the stacked imaging device, the pixel electrodes collecting the charge generated by photoelectric conversion are electrically separated from each other between the pixels. Typically, a space is present between two pixel electrodes adjacent to each other. As a result, part of the light that has entered the photoelectric converting portion sometimes passes through the space between the pixel electrodes. The light that has passed through the space between the pixel electrodes sometimes reaches the channel region of the transistor on the semiconductor substrate by repeating diffuse reflection between the photoelectric converting portion and the semiconductor substrate, for example.

If such stray light enters the channel region of the transistor on the semiconductor substrate, a photoexcited carrier is generated in the channel region. If the photoexcited carrier is generated in the channel region, noise is added to a signal, which results in a reduction in image quality. Moreover, the generation of the photoexcited carrier in the channel region can become a cause of a malfunction of the transistor. Thus, it is beneficial if the arrival of the light that has passed through the space between the pixel electrodes at the channel region of the transistor on the semiconductor substrate can be suppressed.

Description will be given with reference to FIG. 5. FIG. 5 depicts a typical arrangement of the second electrodes 15c of the photoelectric conversion elements 15 and the upper electrodes 41c of the first capacitance elements Cs when viewed from the normal direction of the semiconductor substrate 2. In FIG. 5, four unit pixel cells 10 and virtual lines Px indicating the boundaries between the pixels are depicted.

Figure 5:
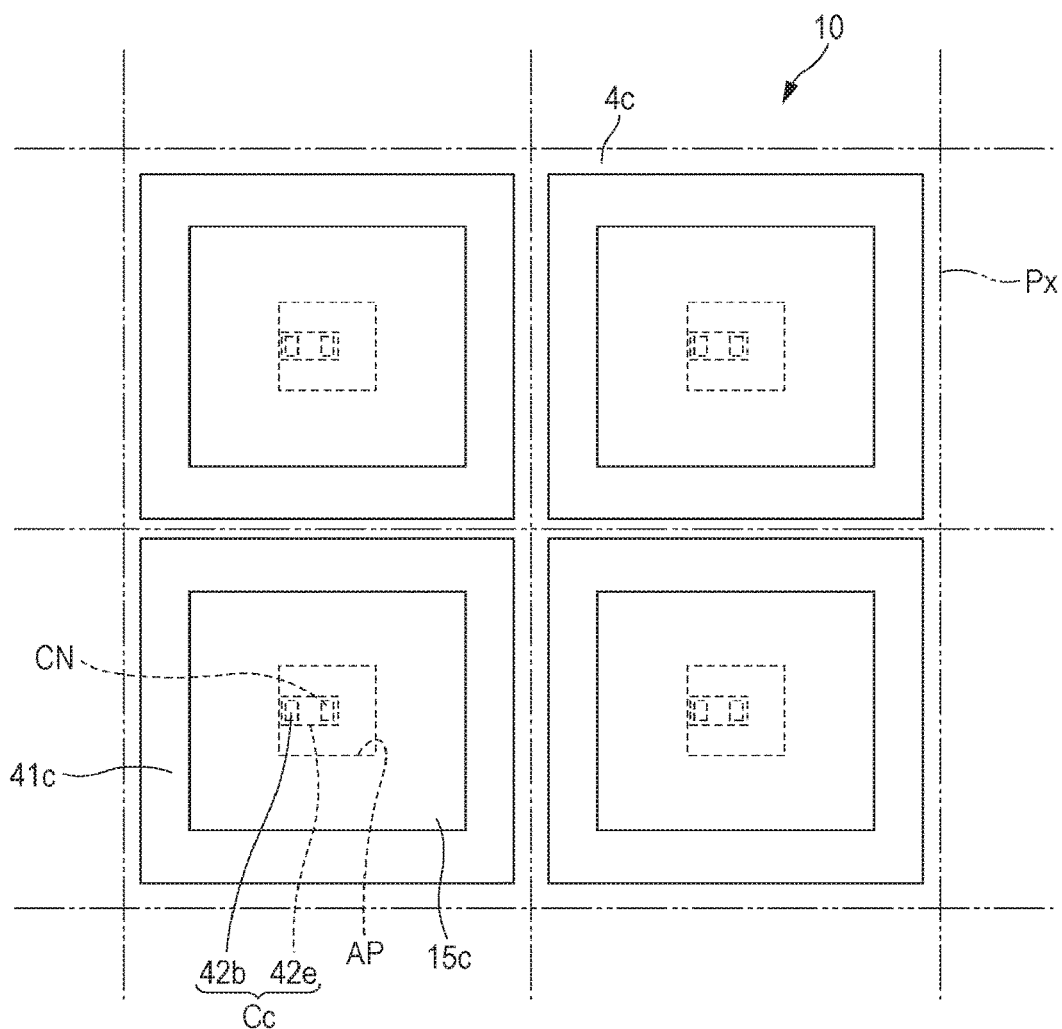
FIG. 5 is a plan view for explaining an example of the arrangement of second electrodes of photoelectric conversion elements and upper electrodes of first capacitance elements when viewed from the normal direction of a semiconductor substrate.

As depicted in FIG. 5, between the second electrodes 15c adjacent to each other, a space for providing electrical separation between the second electrodes 15c is present. In the configuration illustrated in FIG. 5, in each unit pixel cell 10, the upper electrode 41c of the first capacitance element Cs has an area which is larger than the area of the second electrode 15c of the photoelectric conversion element 15. That is, at least part of the upper electrode 41c overlaps with the space between the second electrodes 15c.

By using the light-blocking electrode as the upper electrode 41c and disposing the upper electrode 41c immediately below the space formed between the second electrodes 15c, it is possible to block the light that has passed through the space formed between the second electrodes 15c with the upper electrode 41c. As a result, it is possible to suppress the entrance of the light that has passed through the space formed between the second electrodes 15c to the channel region of the transistor (for example, the signal detection transistor 34) on the semiconductor substrate 2. The upper electrode 41c is a metal electrode or a metal nitride electrode, for example. Examples of the material for forming the upper electrode 41c are Ti, TiN, Ta, TaN, and Mo. Here, TaN is used. For example, by forming a TaN electrode having a thickness of 100 nm as the upper electrode 41c, it is possible to achieve a sufficient light blocking effect.

According to the embodiment of the present disclosure, it is possible to suppress a shift in characteristics of the transistor (for example, fluctuations in a threshold value voltage) by suppressing the entrance of the stray light to the channel region of the transistor on the semiconductor substrate 2. By suppressing the entrance of the stray light to the channel region of the transistor on the semiconductor substrate 2, the characteristics of the transistors of each pixel are stabilized, which makes it possible to reduce variations in the operations of the transistors between the plurality of pixels. As described above, suppressing the entrance of the stray light to the channel region of the transistor on the semiconductor substrate 2 contributes to an increase in the reliability of the imaging device.

Incidentally, in FIG. 5, a configuration in which, as a result of the upper electrodes 41c being spatially separated, the upper electrodes 41c are electrically separated between the unit pixel cells 10 is illustrated. That is, in this example, each upper electrode 41c does not cover the whole of the photosensitive region and, between the upper electrodes 41c adjacent to each other, a slight space is formed.

However, as described earlier with reference to FIG. 3, here, each of the upper electrodes 41c is formed so as to be supplied with a predetermined voltage via the sensitivity adjustment line 32. Thus, it is possible to reduce sufficiently the distance between the upper electrodes 41c adjacent to each other as compared to the distance between the second electrodes 15c adjacent to each other. This makes it possible to block most of the light that has passed through the space formed between the second electrodes 15c with the upper electrode 41c. Incidentally, in the circuit configuration illustrated in FIG. 2, a common voltage is applied to the upper electrodes 41c in the unit pixel cells 10 belonging to the same row. Thus, a plurality of band-like electrodes extending in the row direction across the plurality of columns may be formed as the upper electrodes 41c. In this case, since a space between the upper electrodes is not generated between the adjacent unit pixel cells 10 in the row direction, it is possible to suppress more effectively the entrance of the stray light to the channel region of the transistor on the semiconductor substrate 2. It goes without saying that the upper electrodes 41c may be spatially separated such that one upper electrode 41c is located in each of the unit pixel cells 10 as depicted in FIG. 5 and separate voltages may be supplied to the upper electrodes 41c in the unit pixel cells 10.

In the configuration illustrated in FIG. 5, the via vc connecting the second electrode 15c of the photoelectric conversion element 15 and the upper electrode 42e of the second capacitance element Cc is disposed near the center of the unit pixel cell 10. Here, the upper electrode 41c of the first capacitance element Cs is formed in such a way as to surround the via vc which is part of the connecting portion CN. As described earlier, as a result of a predetermined voltage being supplied via the sensitivity adjustment line 32, the potential of the upper electrode 41c of the first capacitance element Cs when the imaging device 100 is operating is maintained at a fixed potential. Thus, by surrounding the connecting portion CN (here, the via vc which is part of the connecting portion CN) connecting the second electrode 15c of the photoelectric conversion element 15 and the gate electrode 34e of the signal detection transistor 34 with the upper electrode 41c whose potential is fixed, it is possible to make the upper electrode 41c function as a shielding electrode. As a result of the upper electrode 41c functioning as the shielding electrode, the mixing of noise into the charge accumulation node 44 can be suppressed. For example, the electric noise caused in the adjacent unit pixel cells can be absorbed by the upper electrode 41c of the first capacitance element Cs before reaching the connecting portion CN.

In the configuration illustrated in FIG. 5, the upper electrode 41c has a rectangular shape and has a rectangular opening AP near the center thereof. However, the shape of the upper electrode 41c of the first capacitance element Cs observed when the upper electrode 41c is viewed from the normal direction of the semiconductor substrate 2 is not limited to the shape depicted in FIG. 5. For example, the upper electrode 41c may have the shape of the letter C as a result of a cut line connecting the opening AP and the upper electrode 41c being provided. Moreover, for example, the upper electrode 41c may include a plurality of portions. However, from the viewpoint of reducing a bias in capacitance in the unit pixel cell 10, it is beneficial to dispose the connecting portion CN at the center of the unit pixel cell 10 and provide the upper electrode 41c with a shape which is highly symmetric with respect to the connecting portion CN. Incidentally, a configuration in which, instead of fixing the potential of the upper electrode 41c of the first capacitance element Cs, the potential of the lower electrode 41b of the first capacitance element Cs is fixed and the upper electrode 41c of the first capacitance element Cs and the lower electrode 42b of the second capacitance element Cc are electrically connected is also possible. In this case, the lower electrode 41b of the first capacitance element Cs simply has to be formed in such a way as to surround the connecting portion CN.

Back in FIG. 3, as described earlier, the upper electrode 41c can be formed of a metal or a metal nitride, for example. Likewise, the second electrode 15c of the photoelectric conversion element 15, the second electrode 15c located on the insulating layer 4c covering the upper electrode 41c, can also be formed of a metal or a metal nitride. The second electrode 15c may be formed of the same material as the material forming the upper electrode 41c.

In the configuration illustrated in FIG. 3, by using a metal nitride (here, TaN), the upper electrode 41c is formed as a light-blocking electrode. Here, as the material for forming the second electrode 15c of the photoelectric conversion element 15, a metal nitride is used. Examples of the material for forming the second electrode 15c of the photoelectric conversion element 15 are TiN, TaN, and WN.

Metal nitrides have high denseness and have the property of being less likely to cause any one of the movement and the mixing or both of impurity elements even at high temperatures. Thus, by forming each of the upper electrode 41c and the second electrode 15c which are located above the dielectric film 41d of the first capacitance element Cs by using a metal nitride, it is possible to suppress the mixing of carriers caused by impurities into the dielectric film 41d. By suppressing the mixing of impurities into the dielectric film 41d, it is possible to reduce a leakage current between the upper electrode 41c and the lower electrode 41b in the first capacitance element Cs.

Moreover, metal nitrides are less likely to cause migration in sputtering, which makes it easy to form a flat surface. By forming the second electrode 15c of the photoelectric conversion element 15 by using a metal nitride, a junction via a flat interface can be achieved. By suppressing projections and depressions on the surface of the second electrode 15c, it is possible to implement smooth charge transport between the second electrode 15c and the photoelectric conversion film 15b. Moreover, it is possible to curb the generation of a level caused by an interface defect and suppress a dark current. As described above, forming both the upper electrode 41c of the first capacitance element Cs and the second electrode 15c of the photoelectric conversion element 15 by using a metal nitride is beneficial from the viewpoint of reducing the leakage current and the dark current. Furthermore, forming the lower electrode 41b of the first capacitance element Cs by using a metal nitride is beneficial because this can further improve the flatness of the upper electrode 41c and can suppress oxidation of the dielectric film 41d.

Second Embodiment

Figure 6:
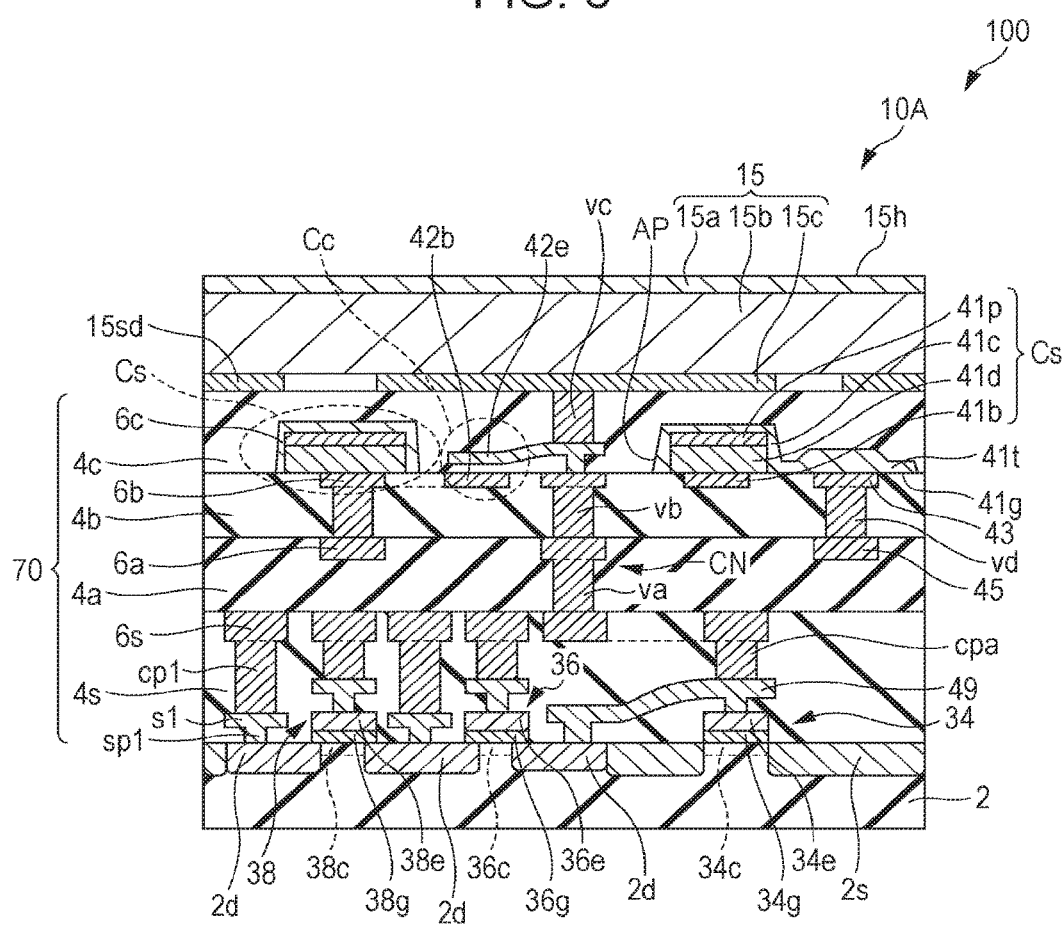
FIG. 6 is a schematic sectional view of a unit pixel cell according to a second embodiment of the present disclosure.

FIG. 6 schematically depicts the cross-section of a unit pixel cell 10A according to a second embodiment of the present disclosure. The unit pixel cell 10A depicted in FIG. 6 differs from the unit pixel cell 10 described with reference to FIG. 3 in that the unit pixel cell 10A has a shielding electrode 15sd formed in the layer in which the second electrode 15c of the photoelectric conversion element 15 is formed. The shielding electrode 15sd is disposed between two unit pixel cells 10A adjacent to each other. Moreover, the shielding electrode 15sd is configured so as to be supplied with a fixed voltage when the imaging device 100 is operating.

In the stacked imaging device, the charge generated in the photoelectric conversion film of a certain unit pixel cell is sometimes collected by the pixel electrode of a unit pixel cell which is different from the certain unit pixel cell. For example, if charge is generated near the boundary between the unit pixel cells, the charge is sometimes collected by a pixel electrode (for example, a pixel electrode in an adjacent unit pixel cell) which is different from a pixel electrode to which the charge should move. Collection of charge by the adjacent pixel can become a cause of color mixture. By providing a shielding electrode maintained at a fixed potential between the unit pixel cells, it is possible to curb an unintended movement of charge to an adjacent pixel. That is, it is possible to reduce the occurrence of color mixture.

Figure 7:
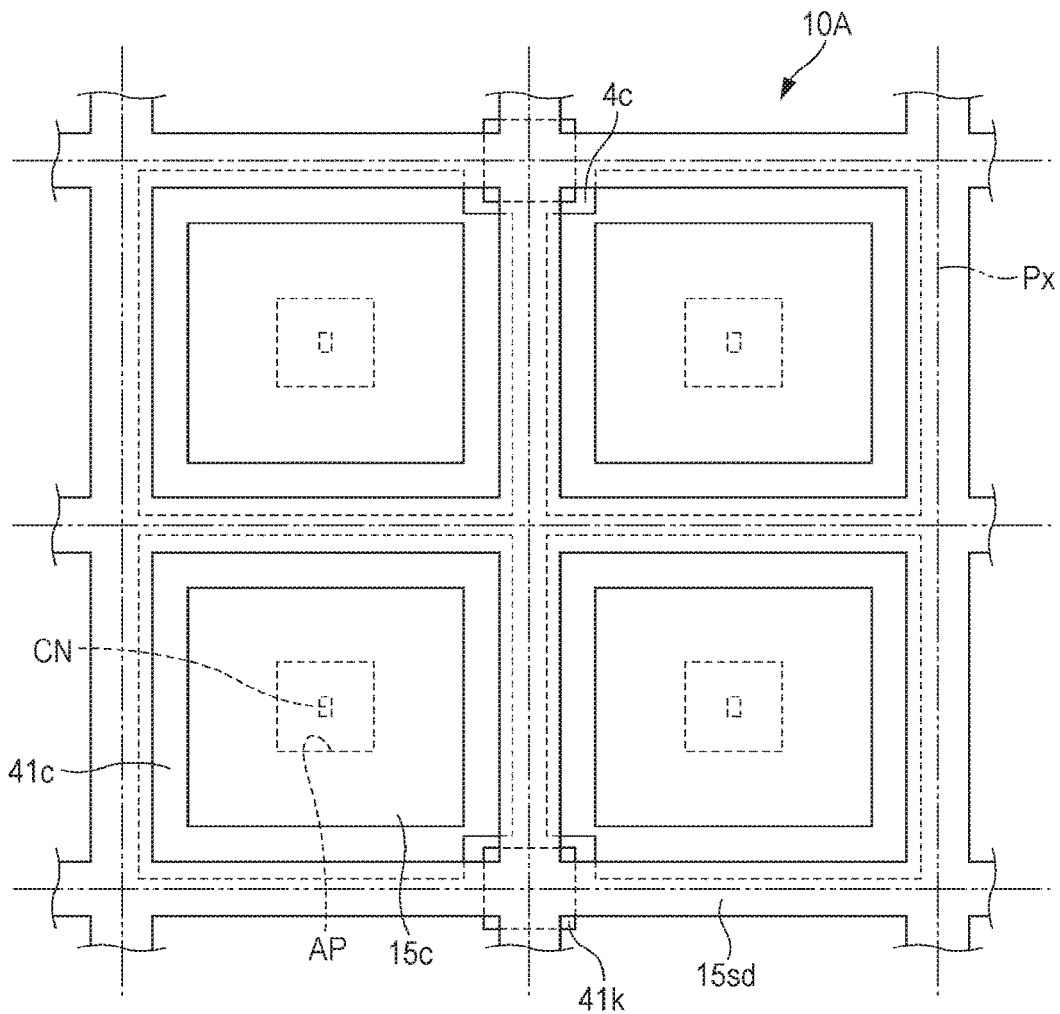
FIG. 7 is a plan view for explaining an example of the arrangement of a shielding electrode, the second electrodes of the photoelectric conversion elements, and the upper electrodes of the first capacitance elements when viewed from the normal direction of the semiconductor substrate.

FIG. 7 depicts a typical arrangement of the shielding electrode 15sd, the second electrodes 15c of the photoelectric conversion elements 15, and the upper electrodes 41c of the first capacitance elements Cs when viewed from the normal direction of the semiconductor substrate 2. In an example depicted in FIG. 7, the shielding electrode 15sd is formed in the shape of a grid including a plurality of portions extending along the boundaries between the unit pixel cells 10A. Here, the shielding electrode 15sd is electrically connected to connecting portions 41k (which are not depicted in FIG. 6) provided in the layer in which the upper electrodes 41c of the first capacitance elements Cs are formed. The shielding electrode 15sd is configured such that a fixed voltage can be applied thereto by being electrically connected to an unillustrated power supply via the connecting portions 41k.

By disposing the shielding electrode 15sd in such a way as to surround the second electrodes 15c of the photoelectric conversion elements 15, it is possible to reduce the parasitic capacitance between the unit pixel cells 10A adjacent to each other and suppress noise. In the example depicted in FIG. 7, the shielding electrode 15sd is disposed so as to surround the second electrodes 15c of the photoelectric conversion elements 15 and, between the shielding electrode 15sd and each second electrode 15c, a space for providing electrical separation between the shielding electrode 15sd and the second electrode 15c is formed. The light that has entered this space can become a cause of a shift in characteristics of the transistor formed on the semiconductor substrate. In the configuration illustrated in FIG. 7, the upper electrode 41c of the first capacitance element Cs is disposed immediately below this space. As a result, by forming the upper electrode 41c as a light-blocking electrode, it is possible to block the light that has entered through the space between the shielding electrode 15sd and the second electrode 15c with the upper electrode 41c and achieve stabilization of the characteristics of the transistor.

Incidentally, in the configuration illustrated in FIG. 7, in order to apply a fixed voltage to the shielding electrode 15sd, the connecting portions 41k are disposed in the layer in which the upper electrodes 41c of the first capacitance elements Cs are formed. The voltage which is applied to the shielding electrode 15sd is typically different from the voltage which is applied to the upper electrodes 41c. Thus, in the configuration depicted in FIG. 7, by providing a space between the connecting portions 41k and the upper electrodes 41c, electrical insulation is provided between the connecting portions 41k and the upper electrodes 41c. Since the space between the connecting portions 41k and the upper electrodes 41c is sufficiently narrower than the space between the shielding electrode 15sd and each second electrode 15c, most of the light that has passed through the space between the shielding electrode 15sd and the second electrode 15c is blocked by the upper electrode 41c. It goes without saying that the shielding electrode 15sd may have a shape that covers the space between the connecting portions 41k and the upper electrodes 41c.

Incidentally, in Japanese Unexamined Patent Application Publication No. 2010-067827, a structure in which a partition wall for preventing color mixture is provided in a color filter or a photoelectric conversion element is disclosed. However, if such a partition wall is provided in the unit pixel cell, a portion of the photoelectric conversion film, the portion that virtually contributes to photoelectric conversion, is reduced. Moreover, since a sufficient amount of light is not obtained, it is difficult to reduce a pixel size. Furthermore, it is generally difficult to form a partition wall with a high aspect ratio in the unit pixel cell, and productivity may be reduced.

According to the embodiment of the present disclosure, the shielding electrode 15sd can be provided with relative ease in the layer in which the second electrodes 15c of the photoelectric conversion elements 15 are formed. According to the embodiment of the present disclosure, since it is possible to suppress color mixture without forming a partition wall in the unit pixel cell, the production process does not become complicated.

(Outline of the Operation of the Imaging Device 100)

Next, with reference to the drawing, an example of the operation of the imaging device 100 will be described. As will be described below, in the configuration described with reference to FIG. 2, by appropriately controlling the gate voltages of the two reset transistors 36 and 38, it is possible to switch between two operation modes with different sensitivities. The two operation modes which are described here are a first mode in which relatively high-sensitive imaging can be performed and a second mode in which relatively low-sensitive imaging can be performed.

Hereinafter, the outline of the operation of the imaging device 100 in the first mode will be described. The first mode is a mode suitable for imaging in low illumination. In low illumination, high sensitivity is beneficial. However, if sensitivity is relatively high, there is a possibility that noise is also amplified. According to the embodiments of the present disclosure, it is possible to perform any one of reduction and removal or both of the influence of kTC noise while achieving relatively high sensitivity.

Figure 8:
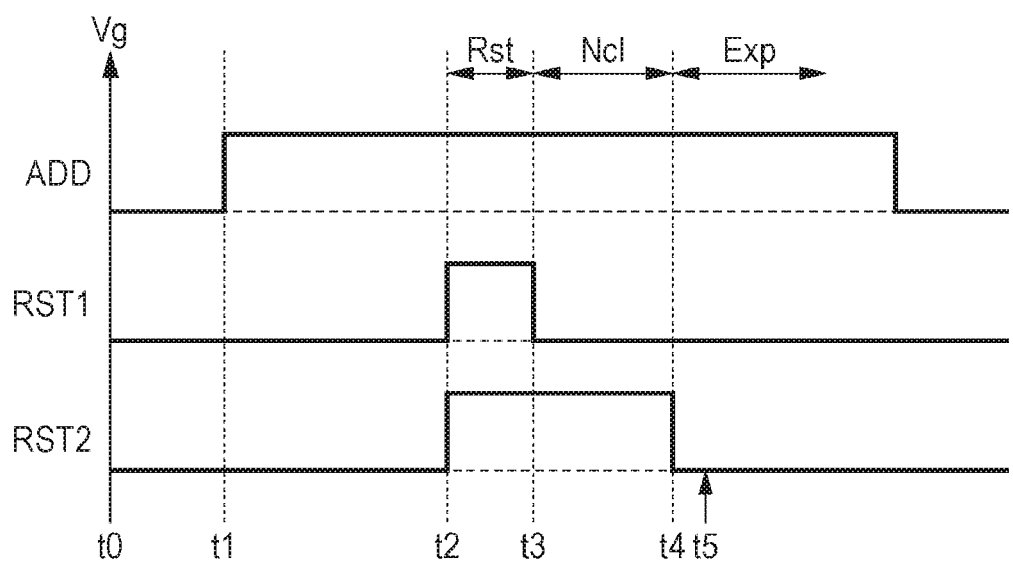
FIG. 8 is a timing diagram for explaining an example of the operations of transistors in a first mode.

FIG. 8 is a timing diagram for explaining an example of the operations of the transistors in the first mode. In FIG. 8, ADD, RST1, and RST2 schematically indicate changes in the gate voltage of the address transistor 40, the gate voltage of the first reset transistor 36, and the gate voltage of the second reset transistor 38, respectively. In the example depicted in FIG. 8, at time t0, all of the address transistor 40, the first reset transistor 36, and the second reset transistor 38 are OFF. For the sake of simplification, an explanation of the operation of an electronic shutter is omitted in the following description.

First, by controlling the potential of the address signal line 30, the address transistor 40 is turned ON (time t1). At this time, reading of the signal charge accumulated in the charge accumulation node 44 is performed.

Next, by controlling the potential of the reset signal line 26 and the potential of the feedback control line 28, the first reset transistor 36 and the second reset transistor 38 are turned ON (time t2). As a result, the charge accumulation node 44 and the feedback line 25 are connected via the first reset transistor 36 and the second reset transistor 38, and a feedback circuit FC that provides negative feedback on the output of the signal detection circuit SC is formed. The formation of the feedback circuit FC is performed on one of the plurality of unit pixel cells 10 which share the feedback line 25.

Here, the feedback circuit FC is a negative feedback amplifier circuit including the signal detection transistor 34, the inverting amplifier 24, and the second reset transistor 38. The address transistor 40 which is turned ON at time t1 supplies the output of the signal detection transistor 34 as an input to the feedback circuit FC.

As a result of the charge accumulation node 44 and the feedback line 25 being electrically connected, the charge accumulation node 44 is reset. At this time, as a result of negative feedback on the output of the signal detection circuit SC being provided, the voltage of the vertical signal line 18 converges to the voltage Vref applied to the negative-and-positive-side input terminals of the inverting amplifier 24. That is, in this example, the reference voltage in resetting is the voltage Vref. In the configuration illustrated in FIG. 2, the voltage Vref can be set arbitrarily within the range between a power supply voltage (for example, 3.3 V) and a ground (0 V). In other words, as the reference voltage in resetting, an arbitrary voltage (for example, a voltage other than the power supply voltage) can be used as long as the voltage is within a fixed range.

Next, the first reset transistor 36 is turned OFF (time t3). Hereinafter, a period from when the first reset transistor 36 and the second reset transistor 38 are turned ON at time t2 to when the first reset transistor 36 is turned OFF (time t2 to time t3 in FIG. 8) is sometimes referred to as a "reset period". In FIG. 8, the reset period is schematically indicated by an arrow Rst. As a result of the first reset transistor 36 being turned OFF at time t3, kTC noise is caused. Therefore, the kTC noise is added to the voltage of the reset charge accumulation node 44.

As is clear from FIG. 2, while the second reset transistor 38 is ON, the state in which the feedback circuit FC is formed continues. Thus, if the gain of the feedback circuit FC is assumed to be A, the kTC noise caused as a result of the first reset transistor 36 being turned OFF at time t3 is cancelled to 1/(1+A).

In this example, the voltage of the vertical signal line 18 observed immediately before the first reset transistor 36 is turned OFF (immediately before the start of noise cancellation) is nearly equal to the voltage Vref applied to the negative-side input terminal of the inverting amplifier 24. As described above, by bringing the voltage of the vertical signal line 18 at the start of noise cancellation closer to the target voltage Vref after noise cancellation, it is possible to cancel the kTC noise in a relatively short time. In the following description, a period from when the first reset transistor 36 is turned OFF to when the second reset transistor 38 is turned OFF (time t3 to time t4 in FIG. 8) is sometimes referred to as a "noise cancellation period". In FIG. 8, the noise cancellation period is schematically indicated by an arrow Ncl.

As described above, according to the embodiments of the present disclosure, it is possible to reduce the kTC noise which is caused as a result of the reset transistor being turned OFF and cancel the caused kTC noise in a relatively short time.

Next, the second reset transistor 38 is turned OFF (time t4) and exposure is performed for a predetermined period. As a result of the second reset transistor 38 being turned OFF at time t4, kTC noise is caused. The kTC noise which is added to the voltage of the charge accumulation node 44 at this time is $(Cfd/C1)^{1/2} \times (C2/(C2+Cfd))$ times the kTC noise which is observed when the first capacitance element Cs and the second capacitance element Cc are not provided in the unit pixel cell 10 and the second reset transistor 38 is connected directly to the charge accumulation node 44. In the above expression, Cfd, C1, and C2 denote the capacitance value of the charge accumulation node 44, the capacitance value of the first capacitance element Cs, and the capacitance value of the second capacitance element Cc, respectively. Incidentally, "x" in the expression represents multiplication. As described above, the larger the capacitance value C1 of the first capacitance element Cs, the smaller the noise itself to be caused, and, the smaller the capacitance value C2 of the second capacitance element Cc, the greater the attenuation factor. Thus, according to the embodiments of the present disclosure, by appropriately setting the capacitance value C1 of the first capacitance element Cs and the capacitance value C2 of the second capacitance element Cc, it is possible to reduce sufficiently the kTC noise which is caused as a result of the second reset transistor 38 being turned OFF.

In FIG. 8, an exposure period is schematically indicated by an arrow Exp. In the exposure period, with predetermined timing, reading of a reset voltage in which the kTC noise is cancelled is performed (time t5). Incidentally, since the reset voltage can be read in a short time, reading of the reset voltage may be performed with the address transistor 40 being kept in the ON state.

By calculating the difference between a signal read between time t1 and time t2 and a signal read at time t5, a signal from which fixed noise is removed is obtained. In this manner, a signal from which the kTC noise and the fixed noise are removed is obtained.

Incidentally, in a state in which the first reset transistor 36 and the second reset transistor 38 are turned OFF, the first capacitance element Cs is connected to the charge accumulation node 44 via the second capacitance element Cc. Here, assume that the charge accumulation node 44 and the first capacitance element Cs are directly connected without the second capacitance element Cc. In this case, the capacitance value of the whole signal charge accumulation region observed when the first capacitance element Cs is connected directly to the charge accumulation node 44 is (Cfd+C1). That is, if the first capacitance element Cs has a relatively large capacitance value C1, the capacitance value of the whole signal charge accumulation region also becomes a large value, which makes it impossible to obtain a high conversion gain (or a high SN ratio). Thus, in the embodiments of the present disclosure, the first capacitance element Cs is connected to the charge accumulation node 44 via the second capacitance element Cc. The capacitance value of the whole signal charge accumulation region in such a configuration is expressed as (Cfd+(C1C2)/(C1+C2)). Here, if the second capacitance element Cc has a relatively small capacitance value C2 and the first capacitance element Cs has a relatively large capacitance value C1, the capacitance value of the whole signal charge accumulation region becomes approximately (Cfd+C2). That is, an increase in the capacitance value of the whole signal charge accumulation region is small. As described above, by connecting the first capacitance element Cs to the charge accumulation node 44 via the second capacitance element Cc having a relatively small capacitance value, it is possible to suppress a reduction in the conversion gain.

Incidentally, the source or the drain of the second reset transistor 38 and the power-supply wiring 22 may be connected and the power supply voltage may be used as the reference voltage in resetting. Also in this case, it is possible to obtain the effect of cancelling the kTC noise which is caused as a result of the first reset transistor 36 being turned OFF and the effect of reducing the kTC noise which is caused as a result of the second reset transistor 38 being turned OFF.

(Modified Example of the Imaging Device)

Figure 9:
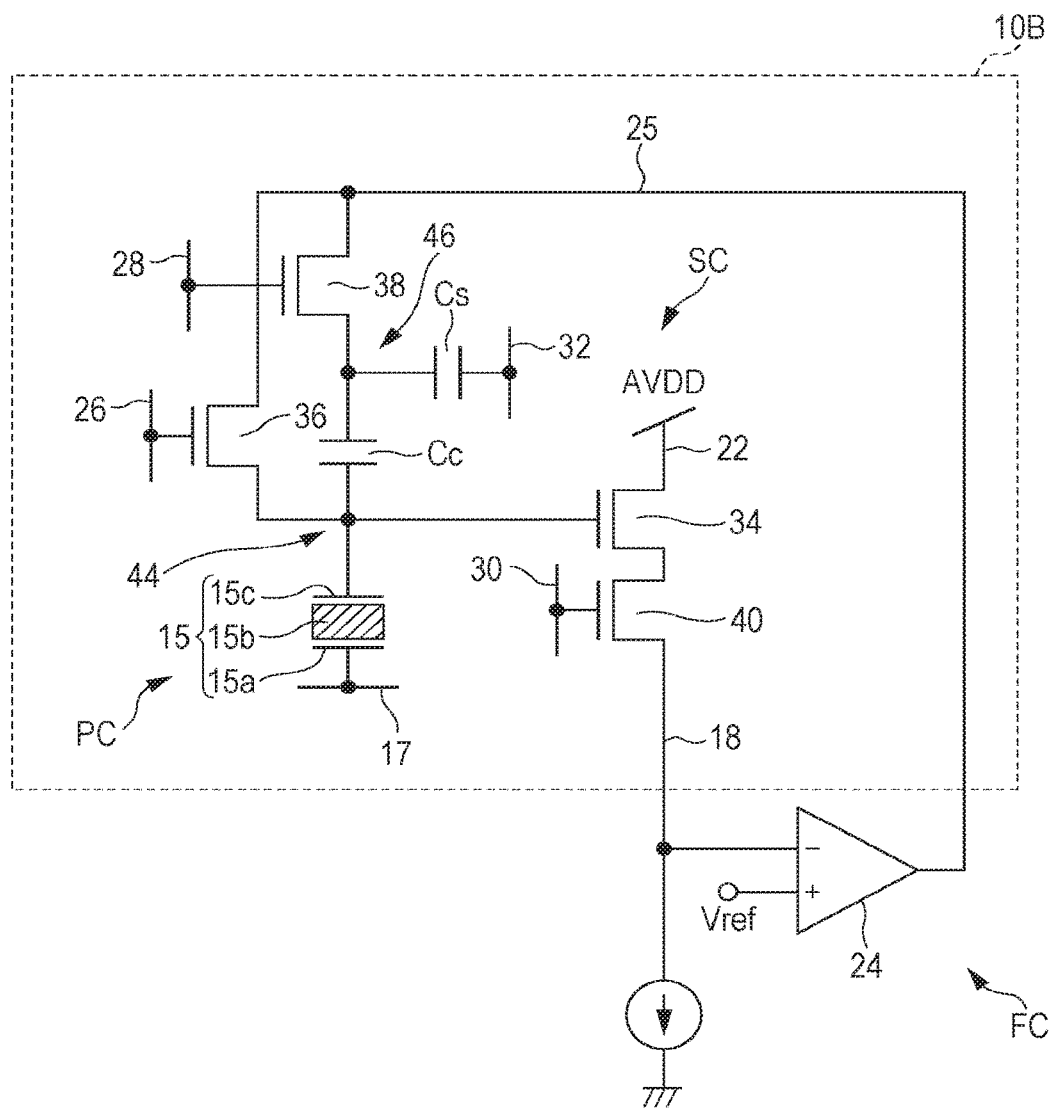
FIG. 9 is a diagram depicting another exemplary circuit configuration of the unit pixel cell.

FIG. 9 schematically depicts another exemplary circuit configuration of the unit pixel cell. A unit pixel cell 10B illustrated in FIG. 9 differs from the unit pixel cell 10 described with reference to FIG. 2 in that, in the unit pixel cell 10B, one of the source and the drain of the reset transistor 36, the one which is not connected to the charge accumulation node 44, is connected to the feedback line 25, not the reset drain node 46. The device structure in the unit pixel cell 10B can be almost the same as the device structure described with reference to FIGS. 3 and 6.

In the configuration illustrated in FIG. 9, switching between the first mode and the second mode which has been described with reference to FIG. 8 cannot be performed. However, since one of the source and the drain of the reset transistor 36, the one which is not connected to the charge accumulation node 44, is connected directly to the feedback line 25, it is possible to obtain the advantage of greater flexibility in designing an impurity profile for securing the driving force of the reset transistor 36. Incidentally, the operation timing of the transistors in the configuration illustrated in FIG. 9 is the same as the operation timing in the first mode described above.

What is claimed is:
1. An imaging device comprising:
a semiconductor substrate;
a photoelectric conversion element that is stacked on the semiconductor substrate and that, in operation, generates a signal by performing photoelectric conversion on incident light;
a multilayer wiring structure including a first wiring layer and a second wiring layer which are provided between the semiconductor substrate and the photoelectric conversion element; and
a circuitry that is provided in the semiconductor substrate and the multilayer wiring structure, and, in operation, processes the signal, wherein
the circuitry includes a first transistor and a first capacitance element,
the first transistor includes a first gate, and a first source region and a first drain region which are provided in the semiconductor substrate,
the first capacitance element includes a first electrode, a second electrode, and a dielectric film disposed between the first electrode and the second electrode,
the first electrode is disposed between the photoelectric conversion element and the first gate of the first transistor,
the multilayer wiring structure includes an insulating layer adjacent to the first capacitance element, and
a permittivity of the dielectric film is higher than a permittivity of the insulating layer.

2. The imaging device according to claim 1, wherein
the first transistor includes a channel region positioned between the first source region and the first drain region, and
when viewed from a normal direction of the semiconductor substrate, at least one of the first electrode and the second electrode overlaps the channel region of the first transistor.

3. The imaging device according to claim 1, further comprising:
a charge accumulation node; and
a second transistor, wherein
the second transistor electrically connects the charge accumulation node and one of the first electrode and the second electrode.

4. The imaging device according to claim 1, wherein
the second electrode is disposed between the first electrode and the first gate of the first transistor.

5. The imaging device according to claim 1, further comprising:
a second capacitance element including a third electrode and a fourth electrode, wherein
one of the third electrode and the fourth electrode is connected to one of the first electrode and the second electrode.

6. The imaging device according to claim 5, wherein
the other of the third electrode and the fourth electrode is connected to the photoelectric conversion element.

7. The imaging device according to claim 5, further comprising:
a charge accumulation node, wherein
the other of the third electrode and the fourth electrode is connected to the charge accumulation node.

8. The imaging device according to claim 1, further comprising:
a signal detection circuit that, in operation, detects the signal; and
a feedback circuit that, in operation, provides negative feedback on an output of the signal detection circuit, wherein
the feedback circuit includes an output line,
the signal detection circuit further includes a reset transistor including a source and a drain, and
one of the source and the drain of the reset transistor is connected to the output line.

9. The imaging device according to claim 8, wherein
the reset transistor electrically connects the output line of the feedback circuit and the photoelectric conversion element.

10. The imaging device according to claim 8, further comprising:
a charge accumulation node, wherein
the reset transistor electrically connects the output line of the feedback circuit and the charge accumulation node.

11. The imaging device according to claim 1, wherein
the multilayer wiring structure further includes a signal line which, in operation, applies a reference voltage to the first electrode,
the first electrode has a first surface facing the photoelectric conversion element and a second surface on a side opposite to the first surface, and
the first electrode is connected to the signal line on the second surface.

12. The imaging device according to claim 1, wherein
the first electrode covers a surface of the dielectric film other than a portion of the surface which faces the second electrode.

13. The imaging device according to claim 1, wherein
the photoelectric conversion element includes a plurality of regions,
each of the plurality of regions corresponds to each of a plurality of pixels in the imaging device, and
when viewed from a normal direction of the semiconductor substrate, at least one of the first electrode and the second electrode overlaps a space disposed between the plurality of regions.

14. The imaging device according to claim 1, wherein
the photoelectric conversion element includes a fifth electrode, a sixth electrode, and a photoelectric conversion film between the fifth electrode and the sixth electrode.

15. The imaging device according to claim 14, wherein
the photoelectric conversion film includes an organic material.

16. The imaging device according to claim 14, further comprising:
pixels arranged two-dimensionally, wherein
the first capacitance element is disposed in each of the pixels,
the photoelectric conversion element is disposed in each of the pixels,
the pixels include a first pixel and a second pixel adjacent to the first pixel,
the first electrode of the first capacitance element in the first pixel is separated from the first electrode of the first capacitance element in the second pixel,
the fifth electrode of the photoelectric conversion element in the first pixel is separated from the fifth electrode of the photoelectric conversion element in the second pixel with a space disposed between the fifth electrode in the first pixel and the fifth electrode in the second pixel, and when viewed from a normal direction of the semiconductor substrate, a part of the first electrode in the first pixel and a part of the first electrode in the second pixel overlap the space.

17. The imaging device according to claim 14, further comprising:

an electrical element disposed on the semiconductor substrate; and a connecting portion electrically connecting the fifth electrode of the photoelectric conversion element and the electrical element, wherein the first electrode of the first capacitance element has an opening or a cutout through which the connecting portion extends, and when viewed from a normal direction of the semiconductor substrate, the opening or the cutout overlaps the fifth electrode.

* * * * *